US00RE46136E

(19) United States
(12) Reissued Patent
Mariner et al.

(10) Patent Number: US RE46,136 E
(45) Date of Reissued Patent: Sep. 6, 2016

(54) HEATING APPARATUS WITH ENHANCED THERMAL UNIFORMITY AND METHOD FOR MAKING THEREOF

(71) Applicant: Momentive Performance Materials Inc., Waterford, NY (US)

(72) Inventors: John Mariner, Avon Lake, OH (US); Ajit Sane, Essex Junction, VT (US); Toshiki Ebata, Osaka (JP); Marc Schaepkens, Clifton Park, NY (US); Xiang Liu, Medina, OH (US); Wei Fan, Strongsville, OH (US)

(73) Assignee: MOMENTIVE PERFORMANCE MATERIALS, Waterford, NY (US)

(21) Appl. No.: 13/790,423

(22) Filed: Mar. 8, 2013

Related U.S. Patent Documents

Reissue of:
(64) Patent No.: 7,901,509
Issued: Mar. 8, 2011
Appl. No.: 11/549,968
Filed: Oct. 16, 2006

U.S. Applications:
(60) Provisional application No. 60/826,150, filed on Sep. 19, 2006.

(51) Int. Cl.
*C23C 16/458* (2006.01)
*H01L 21/67* (2006.01)

(52) U.S. Cl.
CPC ..... *C23C 16/4586* (2013.01); *H01L 21/67103* (2013.01)

(58) Field of Classification Search
CPC ..... C23C 16/46; C23C 16/48; C23C 16/50; C23C 16/4586; C30B 25/16; H01L 21/67098; H01L 21/76828; H01L 21/67248; H01L 21/6831; H01L 21/6833; H01L 21/67103; H01L 21/67126; H01J 37/3497; H01J 37/32715; H01J 37/32724; H01J 2237/2001; H05B 3/06; H05B 3/10; H05B 3/14
USPC ..... 118/724, 725, 728
See application file for complete search history.

(56) References Cited

U.S. PATENT DOCUMENTS 5,343,022 A 8/1994 Gilbert et al. ..... H05B 3/145 118/725
5,566,043 A * 10/1996 Kawada et al. ..... 361/234

(Continued)

FOREIGN PATENT DOCUMENTS

WO 2004068541 8/2004
WO 2006073947 7/2006

OTHER PUBLICATIONS

TC1050 Composite* by Momentive, cited in U.S. Pat. No. 6,072,163 A Nov. 2000.*

(Continued)

*Primary Examiner* — Jeffrie R Lund
(74) *Attorney, Agent, or Firm* — Joseph E. Waters; McDonald Hopkins LLC

(57) ABSTRACT

A heating apparatus for regulating/controlling the surface temperature of a substrate is provided. At least a thermal pyrolytic graphite (TPG) layer is embedded in the heater to diffuse the temperature difference of the various components in the heating apparatus and provide temporal and spatial control of the surface temperature of the substrate, for a relatively uniform substrate temperature with the difference between the maximum and minimum temperature points on the substrate of less than 10° C.

18 Claims, 9 Drawing Sheets

(56) References Cited

U.S. PATENT DOCUMENTS

| | | | | |
|---|---|---|---|---|
| 5,668,524 | A | 9/1997 | Aida et al. | |
| 5,693,581 | A | 12/1997 | Homma et al. | |
| 5,777,543 | A | 7/1998 | Aida et al. | |
| 5,850,071 | A | 12/1998 | Makiguchi et al. | |
| 6,072,163 | A * | 6/2000 | Armstrong | H01L 21/67103 118/724 |
| 6,147,334 | A * | 11/2000 | Hannigan | H01L 21/67103 118/725 |
| 6,215,661 | B1 * | 4/2001 | Messenger et al. | 361/704 |
| 6,292,346 | B1 | 9/2001 | Ohno et al. | |
| 6,324,755 | B1 * | 12/2001 | Borkowski | H05K 1/0207 257/706 |
| 6,497,734 | B1 | 12/2002 | Barber et al. | |
| 6,534,751 | B2 * | 3/2003 | Uchiyama | H01L 21/67103 118/725 |
| 6,563,686 | B2 | 5/2003 | Tsai et al. | |
| 6,765,178 | B2 | 7/2004 | Shang et al. | |
| 6,936,102 | B1 * | 8/2005 | Otsuki et al. | 117/84 |
| 7,901,509 | B2 * | 3/2011 | Mariner | C23C 16/4586 118/715 |
| 2001/0020671 | A1 * | 9/2001 | Ansorge | H01L 27/14603 250/208.1 |
| 2003/0019858 | A1 * | 1/2003 | Dornfest et al. | 219/158 |
| 2004/0035847 | A1 | 2/2004 | Gat | |
| 2004/0074899 | A1 | 4/2004 | Mariner et al. | |
| 2004/0173161 | A1 * | 9/2004 | Mariner et al. | 118/728 |
| 2005/0064230 | A1 * | 3/2005 | Sayir et al. | 428/688 |
| 2006/0076109 | A1 | 4/2006 | Holland et al. | |
| 2006/0228571 | A1 * | 10/2006 | Ohmi et al. | 428/469 |
| 2007/0039942 | A1 * | 2/2007 | Leung et al. | 219/443.1 |
| 2007/0160507 | A1 * | 7/2007 | Satoh et al. | 422/135 |
| 2008/0066676 | A1 * | 3/2008 | Mariner | C23C 16/4586 118/715 |
| 2009/0235866 | A1 * | 9/2009 | Kataigi | C23C 16/45521 118/725 |
| 2010/0155016 | A1 * | 6/2010 | Wood | F01D 25/12 165/51 |
| 2011/0132896 | A1 * | 6/2011 | Quinton, Jr. | H05B 3/68 219/532 |
| 2011/0307089 | A1 * | 12/2011 | Tomoyasu et al. | 700/103 |
| 2014/0209242 | A1 * | 7/2014 | Sun | H01L 21/67103 156/345.34 |

OTHER PUBLICATIONS

English Translation of the Notice of Preliminary Rejection (Office Action), Korean Patent App. No. 2006-0123692, based on U.S. Appl. Nos. 60/826,931 and 11/549,968.

* cited by examiner

HEATING APPARATUS WITH ENHANCED THERMAL UNIFORMITY AND METHOD FOR MAKING THEREOF

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATION

This application claims the benefits of U.S. 60/826,931 filed Sep. 26 2006, which patent application is fully incorporated herein by reference.

FIELD OF INVENTION

The invention relates generally to a heating apparatus for providing a relatively uniform temperature distribution to a substrate in a semiconductor-processing chamber or for heating a metal or ceramic mold for press forming glass lenses.

BACKGROUND OF THE INVENTION

Many semiconductor processes are typically performed in a vacuum environment, i.e., a sealed chamber containing an assembly for supporting the wafer substrate(s) disposed therein. In a semiconductor process, a heating apparatus typically includes a ceramic support that may have electrodes disposed therein to heat the support, and additionally may have electrodes that electrostatically hold the wafer or substrate against the ceramic support, i.e., electrostatic chuck or ESC (also sometimes called susceptors). A semiconductor device fabrication process can take place in the chamber, including deposition, etching, implantation, oxidation, etc. As an example of a deposition process one can conceive of a physical vapor deposition (PVD) process, known as sputter deposition, in which a target generally comprised of a material to be deposited on the wafer substrate is supported above the substrate, typically fastened to a top of the chamber. Plasma is formed from a gas such as argon supplied between the substrate and the target. The target is biased causing ions within the plasma to be accelerated toward the target. The ions of the plasma interact with the target material, and cause atoms of the material to be sputtered off, travel through the chamber toward the wafer, and redeposit on the surface of a semiconductor wafer that is being processed into integrated circuits (IC's). Other deposition processes may include, but are not limited to, plasma enhanced chemical vapor deposition (PECVD), high density plasma chemical vapor deposition (HDP-CVD), low pressure chemical vapor deposition (LPCVD), sub-atmospheric pressure chemical vapor deposition (SACVD), metal organic chemical vapor deposition (MOCVD), molecular beam evaporation (MBE), etc.

In some of the above processes it is desirable to heat the wafer by heating the support. The chemical reaction rate of the materials being deposited, etched, implanted, etc, is controlled to some degree by the temperature of the wafer. Undesirable unevenness in deposition, etching, implantation, etc., over a face of the wafer can easily result if the temperature of the wafer across its area varies too much. In most cases, it is highly desirable that deposition, etching, implantation be uniform to a nearly perfect degree since otherwise the IC's being fabricated at various locations on the wafer will have electronic characteristics that deviate from the norm more than is desirable.

Molded aspheric lenses are commonly used in consumer cameras, camera phones, and CD players due to their low cost and good performance. They are also commonly used for laser diode collimation, and for coupling light into and out of optical fibers. In molding a glass mass to make an aspheric lens, a pair of metal or ceramic molds are used. In this process, a plurality of heaters are used to heat up the molds until the glass mass is softened with the temperature of the glass mass can reach up to 600° C. As with a semiconductor-processing chamber, it is desirable that the molds be uniformly heated and their temperatures be closely controlled.

Various attempts have been tried to control the temperature of a substrate such as a wafer or molded lenses in the prior art. In one example of semiconductor process, an inert coolant gas (such as helium or argon) is admitted at a single pressure within a single thin space between the bottom of the wafer and the top of the ESC which holds the wafer. This approach is referred to as backside gas cooling. Another prior art way of dealing with the need for zone cooling, i.e., uniform temperature control is to vary the surface roughness or to cut a relief pattern to effectively change the local contact area. Yet another way of dealing with the need for zone cooling is to use coolant gas whose pressure is varied to increase and fine-tune thermal transport.

US Patent Publication No. 2006/0144516A1 controls the temperature of a substrate by the use of adhesive materials, i.e., a first layer of adhesive material to bond the metal plate and the heater to the top surface of the temperature controlled base, and a second layer of adhesive material bonds the layer of dielectric material to a top surface of the metal plate. The adhesive possesses physical properties that allow the thermal pattern to be maintained under varying external process conditions.

There still exists a need for a heating apparatus providing relatively uniform temperature distribution to a substrate and a method for controlling the temperature of the substrate placed thereon, during processing of a wafer in semiconductor device fabrication and for other substrates in similar processes.

SUMMARY OF THE INVENTION

In one aspect, the invention relates to an apparatus for supporting a substrate in a process chamber and regulating the surface temperature of the substrate, comprising a base support having a top surface adapted to support the substrate; a heating element for heating the substrate to a temperature of at least 300° C.; a layer of thermal pyrolytic graphite material disposed in the substrate, the thermal pyrolytic graphite (TPG) layer having a thermal conductivity of at least 1000 W/m° C. in a plane parallel to the substrate being supported, wherein the surface temperature of the substrate is regulated for a maximum temperature variation between a lowest point and a highest temperature point on the surface of the substrate of 10° C.

The invention in another aspect relates to a method for regulating the surface temperature of the substrate, by processing the substrate on an apparatus having a base support having a top surface adapted to support the substrate; a heating element for heating the substrate to a temperature of at least 300° C.; a layer of thermal pyrolytic graphite material disposed in the substrate, the thermal pyrolytic graphite (TPG) layer having a thermal conductivity of at least 1000 W/m° C. in a plane parallel to the substrate being supported, wherein the surface temperature of the substrate is regulated for a maximum temperature variation between a lowest point and a highest temperature point on the surface of the substrate of 10° C.

DETAILED DESCRIPTION OF THE INVENTION

Figure 1:
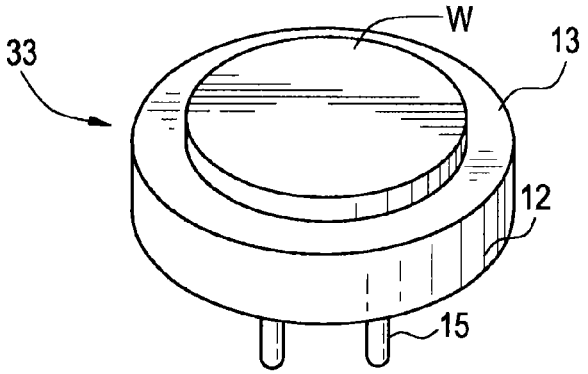
FIG. 1 is a perspective view showing one embodiment of a heating apparatus.

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

Also as used herein, the "heating apparatus," may be used interchangeably with "treating apparatus," "heater," "electrostatic chuck," "chuck," or "processing apparatus," referring to an apparatus containing at least one heating and/or cooling element to regulate the temperature of the substrate supported thereon, specifically, by heating or cooling the substrate.

As used herein, the term "substrate" refers to the semiconductor wafer or the glass mold being supported/heated by the processing apparatus of the invention. As used herein, the term "sheet" may be used interchangeably with "layer."

As used herein, the term "circuit" may be used interchangeably with "electrode," and the term "heating element" may be used interchangeably with "heating electrode," "electrode," "resistor," "heating resistor," or "heater." The term "circuit" may be used in either the single or plural form, denoting that at least one unit is present.

As used herein, thermal uniformity or relatively uniform temperature means that the difference between the maximum and minimum temperature points on the substrate is less than 10° C. In one embodiment, thermal uniformity means the substrate temperature is relatively uniform with a difference between the highest and lowest temperature points to be less than 7° C. In yet another embodiment, the substrate temperature is kept within a variation range of less than 5° C. In a fourth embodiment, the substrate temperature is kept uniform with a variation of less than 2° C.

In a plasma chamber for processing substrates such as semiconductor wafers or glass lenses, the substrate temperature significantly affects the process. For a processing apparatus to uniformly regulate the temperature of the substrate being treated, it is desirable for the apparatus to provide temporal and spatial control of the surface temperature of the substrate. Graphite is an anisotropic material with a unique ability to direct heat in a preferred direction. Thermal pyrolytic graphite (TPG) is a unique graphite material consisting of crystallites of considerable size, the crystallites being highly aligned or oriented with respect to each other and having well ordered carbon layers or a high degree of preferred crystallite orientation. TPG may be may be used interchangeably with "highly oriented pyrolytic graphite" ("HOPG"), or compression annealed pyrolytic graphite ("CAPG"). TPG is extremely thermally conductive with an in-plane (a-b direction) thermal conductivity greater than 1000 W/m-K, while the thermal conductivity in the out-of-plane (z-direction) is in the range of 20 to 30 W/m-K. In one embodiment, TPG has an in-plane thermal conductivity greater than 1,500 W/m-K.

In various embodiments of the heater apparatus, at least a layer of TPG is embedded in the heater to provide spatial control of the surface temperature of the substrate and diffuse the temperature difference of the various components in the heating apparatus, allowing the temperature of the target substrate to be relatively uniform even for heating element with an imperfect, e.g., uneven, contact surface. In operations, a semiconductor wafer substrate or a glass mold is typically heated to a temperature of at least 300° C. and then cooled down to room temperature. The heating apparatus with at least an embedded layer of TPG provides effective heat conduction/cooling between a heating/cooling element and a substrate with excellent thermal uniformity.

In one embodiment, the TPG layer has a thickness ranging from about 0.5 mm to 15 mm with thickness variation (parallelism) within 0.005 mm. In another embodiment. the TPG layer has a thickness in the range of 1 mm to 10 mm. In a third embodiment, the TPG layer has a thickness in the range of 2 to 8 mm. The TPG layer may be embedded in the heater of the invention as a single layer by itself, or in one embodiment for a heater with a metal substrate (see FIGS. 2 and 3A-3C), the TPG layer can be in an encapsulated form, e.g., a TPG core encapsulated within a structural metallic shell. Encapsulated TPG is commercially available from GE Advanced Ceramics of Strongsville, Ohio as TC1050® encapsulated TPG. TPG can be incorporated into the heater as a contiguous single sheet, or in one embodiment as illustrated in FIGS. 5B and 7E, a plurality of smaller TPG pieces in an overlapping/mosaic configuration.

In one embodiment, the TPG is held in place and embedded within the heater simply by the adhesion of the underlying substrate and/or overcoat where they make contact. In another embodiment, the TPG (in a pure TPG sheet form, or as an encapsulated TPG core in a metal casing, as pure thermal pyrolytic graphite in small piece sizes such as rectangular, square pieces; in random sizes; or in "strips") is glued in place using a high-temperature adhesive known in the art, e.g., CERAMBOND from Aremco, a silicone bond having a thermal transfer coefficient.

Embodiments of the heating apparatus are illustrated as follows, by way of a description of the materials being employed, the assembly of the components, the manufacturing process thereof and also with references to the figures.

General Embodiments of the Heating Apparatus: In one embodiment, the heating apparatus 33 is as illustrated in FIG. 1, comprising a disk-shaped metallic or ceramic substrate 12 having electrode 16 buried therein (not shown), whose top surface 13 serves as a supporting surface for a substrate, e.g., a wafer having a typical diameter of 300 mm or a glass mold W. In one embodiment, the top surface 13 is made of a high degree of flatness (within 0.05 mm surface variation) to further enhance the temperature control of the substrate W. Electric terminals 15 for supplying electricity to the heating resistor can be attached at the center of the bottom surface of the substrate 12, or in one embodiment, at the sides of the substrate 12.

In one embodiment, the top surface 13 is relatively uniform in temperature, i.e., the difference between a maximum and a minimum temperatures on the top surface is less than 10° C. In a second embodiment, the temperature difference is less than 5° C. In temperature uniformity of the top surface 13 corresponds to a uniform temperature of the substrate W being heated. In one embodiment, the substrate W has a maximum temperature variation of 5° C., and in a second embodiment a maximum temperature variation of 2° C.

In the heater apparatus, one or more electrodes can be employed. Depending on the application, the electrode may function as a resistive heating element, a plasma-generating electrode, an electrostatic chuck electrode, or an electron-beam electrode. The electrode can be embedded within the substrate of the heater toward the top (near the wafer substrate) or the bottom (away from the wafer substrate). A bottom location may help diffuse the pattern of the electrode and assist in the heat distribution to the wafer substrate.

In one embodiment, the electrode is in the form of a film electrode and formed by processes known in the art including screen-printing, spin coating, plasma spray, spray pyrolysis, reactive spray deposition, sol-gel, combustion torch, electric arc, ion plating, ion implantation, sputtering deposition, laser ablation, evaporation, electroplating, and laser surface alloying. In one embodiment, the film electrode comprises a metal having a high melting point, e.g., tungsten, molybdenum, rhenium and platinum or alloys thereof. In another embodiment, the film electrode comprises at least one of carbides or oxides of hafnium, zirconium, cerium, and mixtures thereof.

In another embodiment, the electrode layer is in the form an elongated continuous strip of pyrolytic graphite. Pyrolytic graphite ("PG") is first deposited onto a heater base, e.g., pyrolytic boron nitride coated graphite base, via processes known in the art such as chemical vapor deposition. The PG is then is machined into a pre-determined pattern, e.g., a spiral, a serpentine, etc. The forming of the electrical pattern of the heating zones, i.e., an electrically isolated, resistive heater path, may be done by techniques known in the art, including but not limited to micro machining, micro-brading, laser cutting, chemical etching, or e-beam etching.

Figure 2:
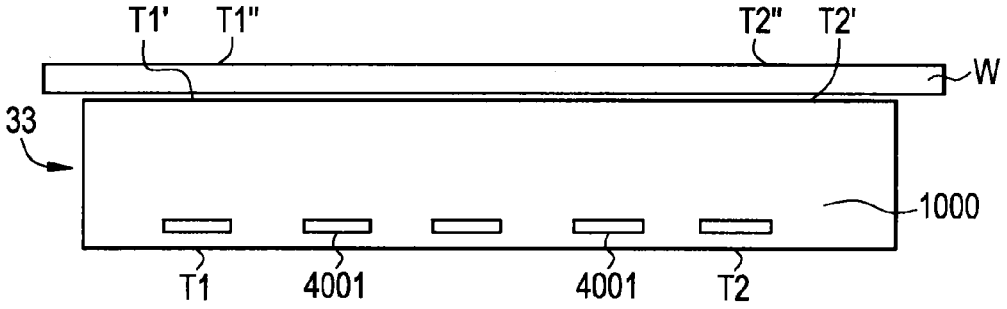
FIG. 2 is a cross-sectional view of an embodiment of a metal heater in the prior art.

Metal Heater: Embodiments of the heater can be illustrated by first referencing various embodiments of heaters in the prior art as shown in FIG. 2. In FIG. 2, a prior art heater 33 comprises a metal substrate 1000 made of a high temperature material, e.g., copper or aluminum alloy such as A6061. Electrodes 4001 are embedded within the metal substrate 1000. Electrodes in one embodiment comprise an electric wire surrounded by heat conductive ceramic insulation, commercially available as Calrod® heating element. In one embodiment, the Calrod® heating element has a non-uniform serpentine pattern in order to provide a tailored heat distribution across the top surface of the heater.

In typical embodiments of the prior art as illustrated in FIG. 2, the temperature generated by the embedded heating element 4001 is not uniformly distributed, i.e., T1-T2 can be substantially different of 50° C. or more. As a result, the temperature on the top side of the heater, e.g., T1' and T2', will generally not be uniformly distributed either with a temperature difference that can be 20° C. or more. Subsequently, the temperature distribution on the substrate W will not be uniformly distributed, with a temperature difference between two extreme temperature points that can be >10° C. Non-uniform wafer temperature (e.g., T1"-T2">10° C.) is undesirable from a semiconductor processing point of view, as it can cause yield loss in semiconductor device fabrication.

Figure 3A:
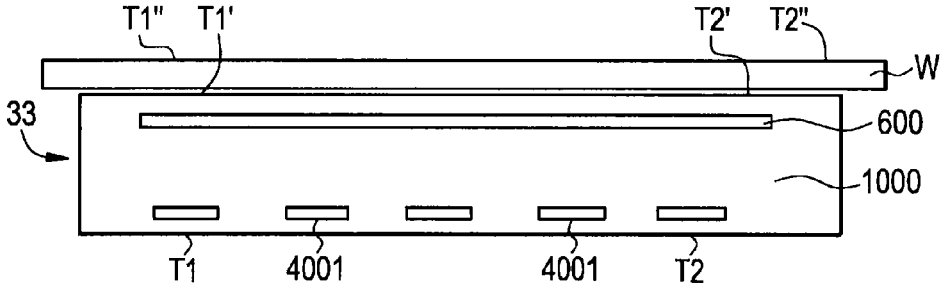
FIGS. 3A, 3B, 3C are cross-sectional views of various embodiments of a heater comprising a metal based substrate.
Figure 3B:
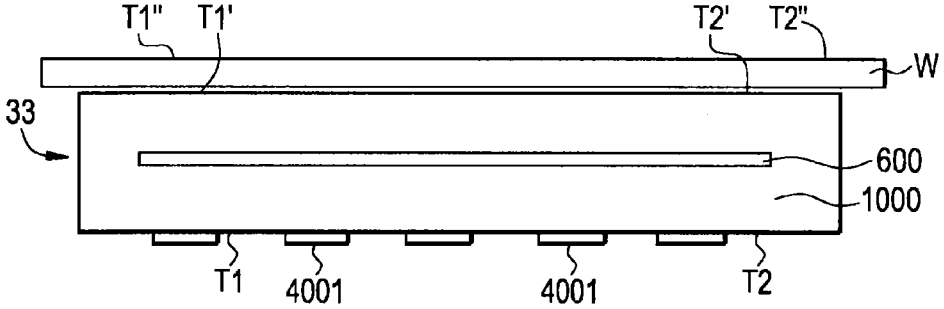
Figure 3C:
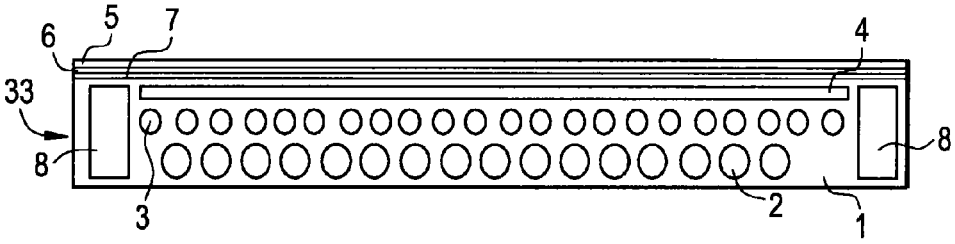

In embodiments of a metal heater as illustrated in FIGS. 3A-3C, at least a TPG heat spreader 600 is embedded in the metal substrate 1000 to spatially distribute and regulate heat removal and/or distribution to the substrate W, for relatively uniform temperature across the substrate W. In one embodiment, the heat spreader 600 comprises a core of TPG encapsulated within a structural metallic shell.

FIG. 3A illustrates one embodiment of a metal heater with electrode 4001 in the form of an electric wire surrounded by heat conductive ceramic insulation (not shown) and embedded within the metal substrate 1000. FIG. 3B illustrates another embodiment of a heater with a metal substrate and a film electrode 4001 having a thickness ranging from 5-1000 μm, electrically insulated and formed on metal base substrate 18. FIG. 3C illustrates yet another embodiment of a heater 33 with a metal substrate. The metal substrate 1 comprises copper or aluminum alloy, and houses a plurality of water-cooling passes 2 and electrical heating coils 3. The top face of the metal substrate 1 includes a conductive electrode layer 6 sandwiched between two dielectric layers 5 and 7 comprising diamond-like carbon (DLC). A TPG layer 4 is superimposed between the heaters 3, the coolers 2, and the top face. The TPG layer, due to its anisotropic thermal conductivity, enhances the thermal conductivity and regulates the temperature distribution to a wafer placed on the heater 33 (not shown). The outside of the heater assembly is provided with an annular ring 8 of a thermal insulating material such as alumina to additionally enhance thermal uniformity.

Figure 4:
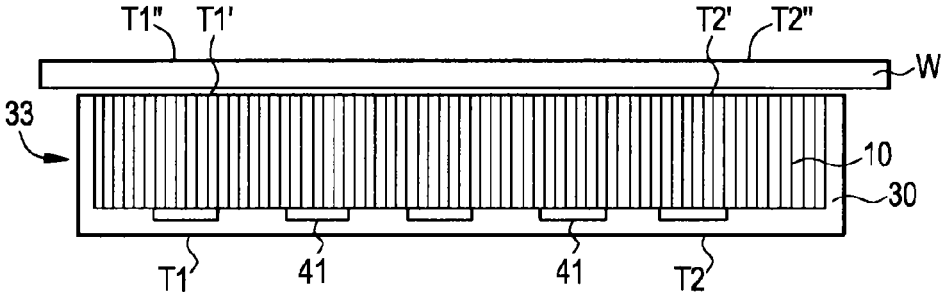
FIG. 4 is a cross-sectional view of an embodiment of a heater in the prior art, for a heater with a ceramic core.

Ceramic Core Heater: Embodiments of a heater having a ceramic core can be illustrated by first referencing a ceramic core heater in the prior art as shown in FIG. 4. In a ceramic core heater, the base substrate 10 comprises an electrically insulating material (e.g., a sintered substrate) selected from the group of oxides, nitrides, carbides, carbonitrides, and oxynitrides of elements selected from a group consisting of B, Al, Si, Ga, Y, refractory hard metals, transition metals; and combinations thereof. The base substrate 10 is characterized has having high wear resistance and high heat resistance properties. In one embodiment, the base substrate 10 comprises AlN of >99.7% purity and a sintering agent selected from $Y_2O_3$, $Er_2O_3$, and combinations thereof.

The base substrate 10 is coated with an overcoat layer 30 that is electrically insulating. In one embodiment, there is an optional a tie-layer (not shown) to help enhance the adhesion between the layer 30 and the base substrate 10. Examples of electrically conductive material include graphite; refractory metals such as W and Mo, transition metals, rare earth metals and alloys; oxides and carbides of hafnium, zirconium, and cerium, and mixtures thereof.

With respect to the overcoat layer 30, the layer 30 comprises at least one of an oxide, nitride, carbide, carbonitride or oxynitride of elements selected from a group consisting of B, Al, Si, Ga, Y, refractory hard metals, transition metals; oxide, oxynitride of aluminum; and combinations thereof, a high thermal stability zirconium phosphate having an NZP structure of $NaZr_2$ $(PO_4)_3$; a glass-ceramic composition containing at least one element selected from the group consisting of elements of the group 2a, group 3a and group 4a; a $BaO—Al_2O_3—B_2O_3—SiO_2$ glass; and a mixture of $SiO_2$ and a plasma-resistant material comprising an oxide of Y, Sc, La, Ce, Gd, Eu, Dy, or the like, or a fluoride of one of these metals, or yttrium-aluminum-garnet (YAG); and combinations thereof.

With respect to the optional tie-layer, the layer comprises at least one of: a nitride, carbide, carbonitride, boride, oxide, oxynitride of elements selected from Al, Si, refractory metals including Ta, W, Mo, transition metals including titanium, chromium, iron; and mixtures thereof. Examples include TiC, TaC, SiC, MoC, and mixtures thereof.

A conducting electrode 41 having an optimized circuit design is formed on in the ceramic substrate 10. The electrode 41 comprises a material selected from the group of tungsten, molybdenum, rhenium and platinum or alloys thereof; carbides and nitrides of metals belonging to Groups IVa, Va and VIa of the Periodic Table; carbides or oxides of hafnium, zirconium, and cerium, and combinations thereof. In one embodiment, the electrode 41 comprises a material having a CTE that closely matches the CTE of the substrate 10 (or its coating layer 30). By closely matching CTEs, it means one material having a CTE ranging from 0.75 to 1.25 the CTE of the second material.

The temperature distribution on the substrate W in a heater of the prior art is typically not uniformly distributed, e.g., T1"-T2">10° C. In various embodiments of a heater having a ceramic core as illustrated in FIGS. 5A to 5E, the embedded TPG heat spreader 600 spatially distributes and regulates heat removal and/or distribution to the substrate W, for relatively uniform temperature across the substrate W with a relatively uniform temperature distribution with T1"-T2" of less than 10° C. in one embodiment, and less than 5° C. in another embodiment.

Figure 5A:
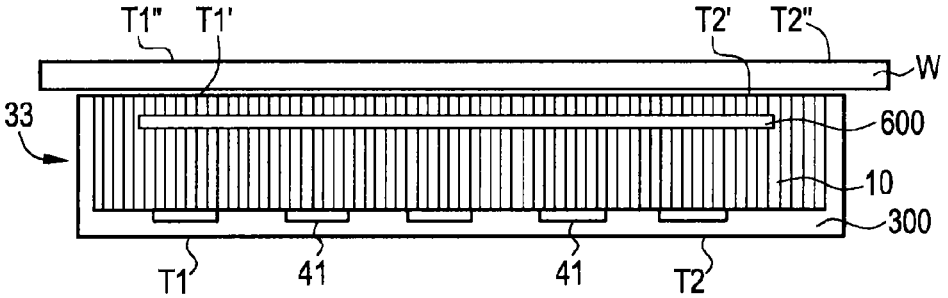
FIGS. 5A, 5B, 5C, 5D, and 5E are cross-sectional views of various embodiments of a heater comprising a ceramic core for a substrate.
Figure 5B:
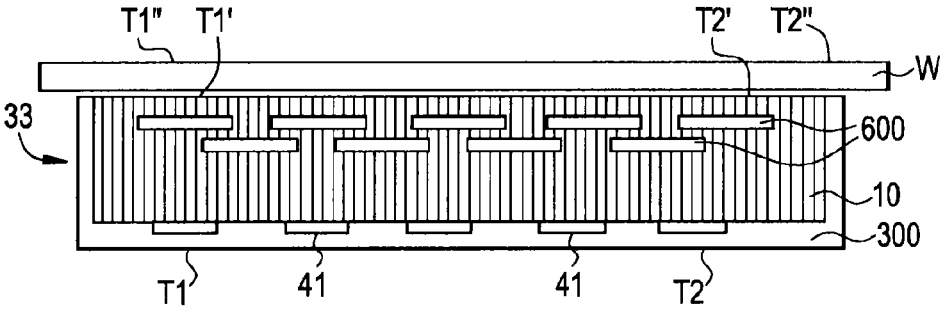

In one embodiment as illustrated in FIG. 5A, at least a TPG layer 600 is inserted between 2 layers (or slabs) of green body prior to the final sintering process. In another embodiment, the TPG layer is inserted into the ceramic material, e.g., AlN, prior to hot pressing. In yet other embodiments, the TPG layer (in the form of pure TPG or encapsulated TPG) is embedded in the ceramic substrate via processes known in the art, including but not limited to slip casting. After the TPG layer is embedded, electrode 41 is patterned onto the ceramic substrate 10, and the base substrate along with the electrode 41 are subsequently overcoated with an electronically insulating layer 30.

In another embodiment of the heater as illustrated in FIG. 5B, two layers of TPG are employed in the ceramic substrate. As shown, holes are punched through the TPG layer for adhesion promotion between the ceramic material layers. The holes can also be situated to offset one another for better temperature distribution and regulation.

Figure 5C:
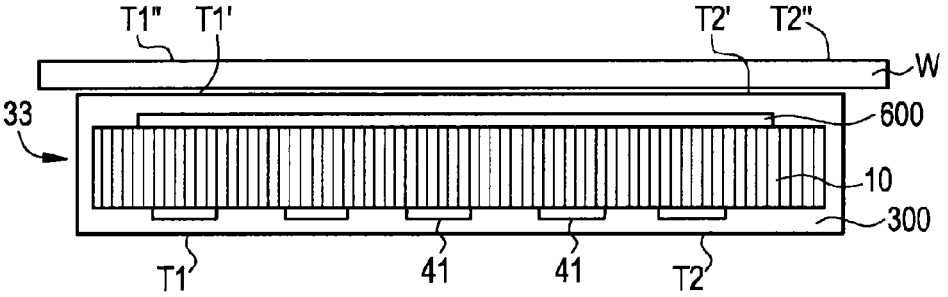

In FIG. 5C, the TPG layer is not embedded in the ceramic substrate 10 as in previous embodiments. In this embodiment, the TPG layer is placed on top of the ceramic substrate 10 (opposite side of the electrode 41) prior to the application of the overcoat 30. In one embodiment, the TPG layer 600 is securely glued to the ceramic substrate 10 first before overcoat 30 is applied.

Figure 5D:
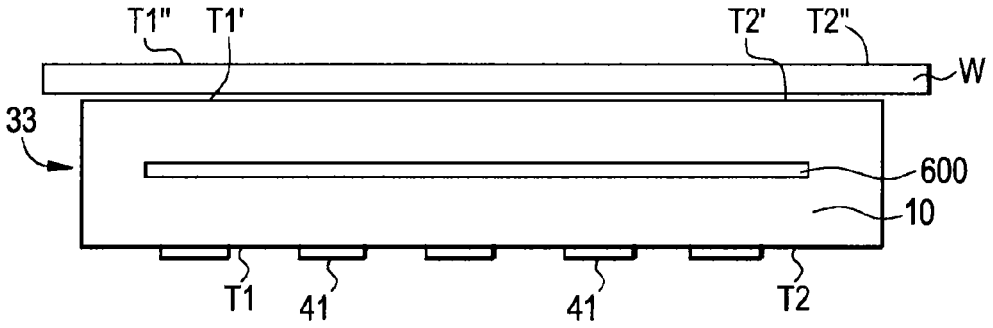

In FIG. 5D, a heater 33 is provided wherein the TPG layer 600 is first coated with ceramic coating layer or a tie layer (not shown) prior to being embedded in the ceramic substrate 10 through sintering. In one embodiment, the coating for the TPG layer 600 comprises at least one of: a nitride, carbide, carbonitride, boride, oxide, oxynitride of elements selected from Al, Si, refractory metals including Ta, W, Mo, transition metals including titanium, chromium, iron; and mixtures thereof.

Figure 5E:
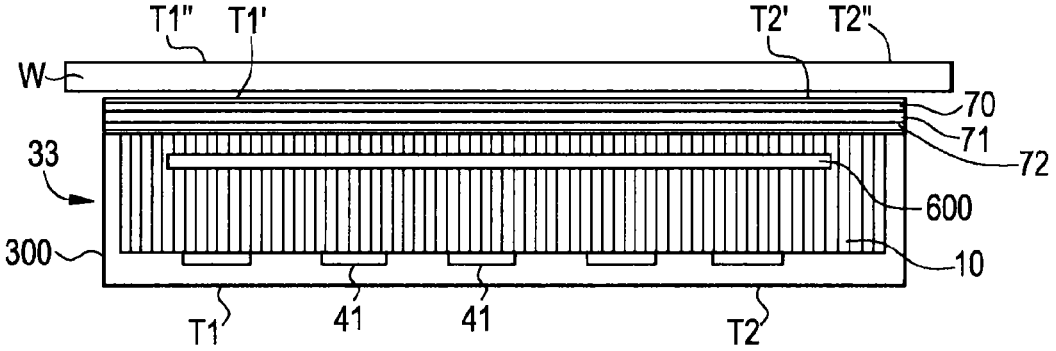

FIG. 5E illustrates an embodiment wherein the heater also functions as an electrostatic chuck. In this embodiment, layers 70 and 72 comprise the same or different dielectric materials, e.g., alumina or diamond-like-carbon (DLC). Layer 71 is a chuck electrode, e.g., a conductive layer such as a metalized film. The layers are bonded to one another and to the substrate 10 using a high-temperature adhesive known in the art. At least a TPG layer (as a TPG sheet or an encapsulated TPG core) 600 is patterned and embedded in the ceramic core 10 using ceramic fabrication methods known in the art.

Figure 5F:
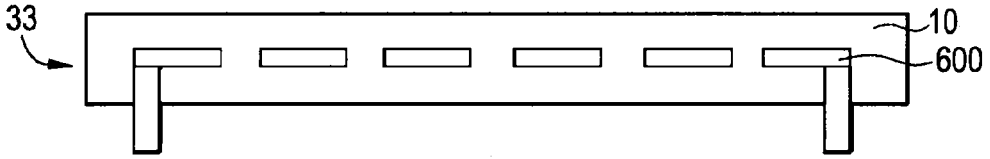
FIGS. 5F and 5G are cross-sectional views of various embodiments of a heater comprising a thermal pyrolytic graphite layer as an electrode.

In FIG. 5F, the thermal pyrolytic graphite layer 600 is patterned and embedded into the ceramic core 10 using ceramic fabrication methods known in the art, but in this embodiment, the TPG layer 600 also functions as an continuous electrode as well as thermal spreader. Since TPG is also electrically conductive with resistivity $\sim 0.5\times10^{-3}$ ohm-cm, it performs as heating element in such case that the substrate temperature can be regulated. In addition, the high thermal conductivity of TPG helps to distribute the generated heat more evenly and thus helps achieve the desired thermal uniformity.

Figure 5G:
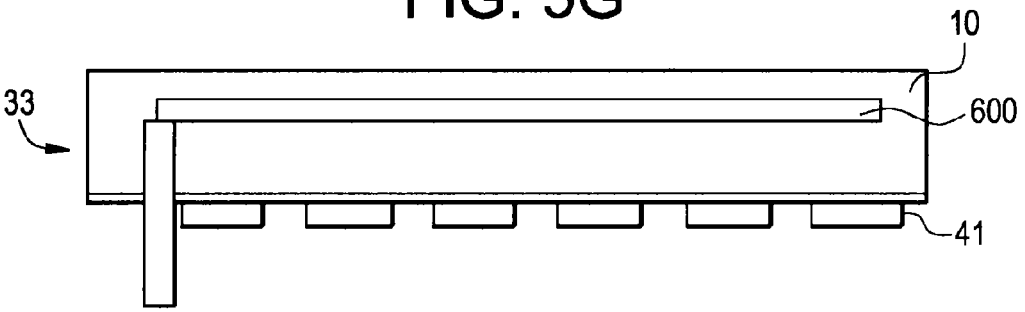

In FIG. 5G, the TPG layer is embedded into the ceramic substrate and electrically connected to external source or ground. Besides the function as a high thermal conductive plane, the TPG layer in this configuration can be also used as RF electrode to enhance the plasma inside the wafer process apparatus, or as a RF shield to eliminate the electrical interference between the RF field and the heating elements.

Figure 5H:
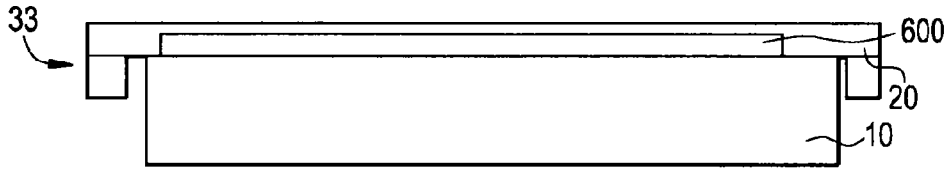
FIG. 5H is a cross sectional view of an embodiment of a heater wherein the pyrolytic graphite layer is encapsulated in the susceptor.

FIG. 5H illustrates an embodiment wherein a susceptor 20 is placed on top of the heater 33. The TPG layer 600 is encapsulated in the susceptor 20, which comprises materials known in the art for making susceptors, e.g., metal, ceramic, graphite, polymer materials or combinations thereof. The high thermal conductivity direction of TPG is in the plane of the TPG layer 600. In one embodiment, the susceptor 20 comprises aluminum. In another embodiment, the susceptor 20 comprises anodized aluminum, in which the TPG layer 600 is encapsulated.

Figure 5I:
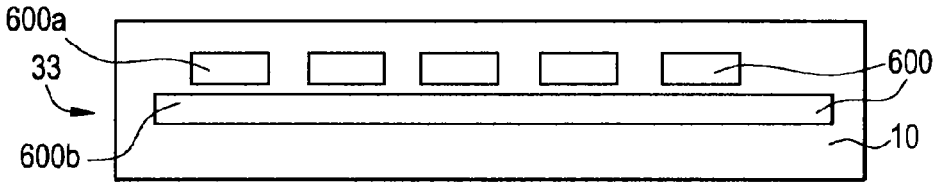
FIG. 5I is a cross-sectional view of an embodiment of a heater wherein the pyrolytic graphite is used in a perpendicularly overlapping configuration.
Figure 5J:
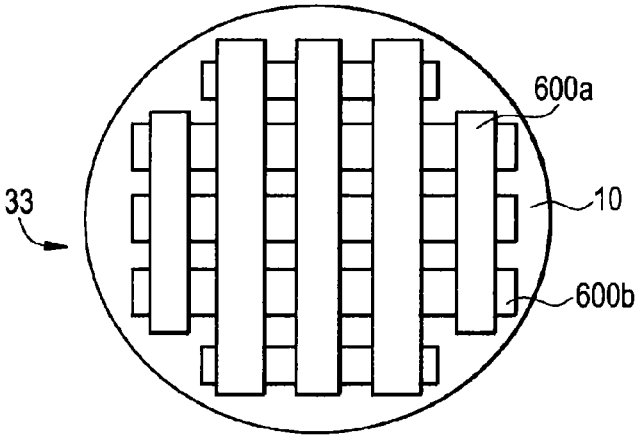
FIG. 5J is a top view of the embodiment of FIG. 5I.

In the embodiment of FIG. 5I, a plurality of smaller TPG pieces or strips are employed in a perpendicularly overlapping configuration, forming "stripes." In one embodiment, an array of TPG strips 600A are embedded in the heater within one plane with the longitudinal direction of the TPG strips being substantially parallel to each other. Another array of TPG strips 600B are embedded in another plane lower than the first plane 600A, with the longitudinal direction of the strips 600B being substantially perpendicular to the longitudinal direction of the TPG strips 600A in the first plane. In both planes, the high thermal conductivity direction of TPG is in the same plane of the TPG strip. FIG. 5J is the top view of the overlapping configuration of FIG. 5I.

Graphite Core Heater: References are made to FIG. 6 for an embodiment of a graphite core heater 33 in the prior art with a graphite core substrate 100. Although graphite is denoted as the core 100, depending on the application, other electrically conductive materials may be used, including but not limited to graphite; refractory metals such as W and Mo, transition metals, rare earth metals and alloys; oxides and carbides of hafnium, zirconium, and cerium, and mixtures thereof. The core 100 is coated with an overcoat layer 200 that is electrically insulating, and optionally a tie-layer (not shown) to help enhance the adhesion between the overcoat layer 200 and the base substrate core 100. With respect to the overcoat layer 200, the layer comprises at least one of an oxide, nitride, carbide, carbonitride or oxynitride of elements selected from a group consisting of B, Al, Si, Ga, Y, refractory hard metals, transition metals; oxide, oxynitride of aluminum; and combinations thereof. An example is pyrolytic boron nitride (pBN). With respect to the optional tie-layer, the layer comprises at least one of: a nitride, carbide, carbonitride, boride, oxide, oxynitride of elements selected from Al, Si, refractory metals including Ta, W, Mo, transition metals including titanium, chromium, iron; and mixtures thereof. Examples include TiC, TaC, SiC, MoC, and mixtures thereof.

The electrode 401 comprises a film electrode 16 having a thickness ranging from 5-1000 μm, which is formed on the electrically insulating layer 200 by processes known in the art. In one embodiment, the film electrode 401 comprises a metal having a high melting point, e.g., tungsten, molybdenum, rhenium and platinum or alloys thereof. In another embodiment, the film electrode 401 comprises at least one of carbides or oxides of hafnium, zirconium, cerium, and mixtures thereof. In one example, an electrolytic copper foil having a film thickness of 18 μm is used as electrode 401.

The heater 33 is further coated with an etch resistant protective coating film 300, comprising at least a nitride, carbide, carbonitride or oxynitride of elements selected from a group consisting of B, Al, Si, Ga, Y, refractory hard metals, transition metals, and combinations thereof, having a CTE ranging from $2.0\times10^{-6}$/K to $10\times10^{-6}$/K in a temperature range of 25 to 1000° C. In another embodiment, the layer 300 comprises a high thermal stability zirconium phosphate. In a third embodiment, the layer 300 contains a glass-ceramic composition containing at least one element selected from the group consisting of elements of the group 2a, group 3a and group 4a of the periodic table of element. Examples of suitable glass-ceramic compositions include lanthanum aluminosilicate (LAS), magnesium aluminosilicate (MAS), calcium aluminosilicate (CAS), and yttrium aluminosilicate (YAS). The thickness of the protective coating layer 300 varies depending upon the application and the process used, e.g., CVD, ion plating, ETP, etc, varying from 1 μm to a few hundred μm.

Figure 6:
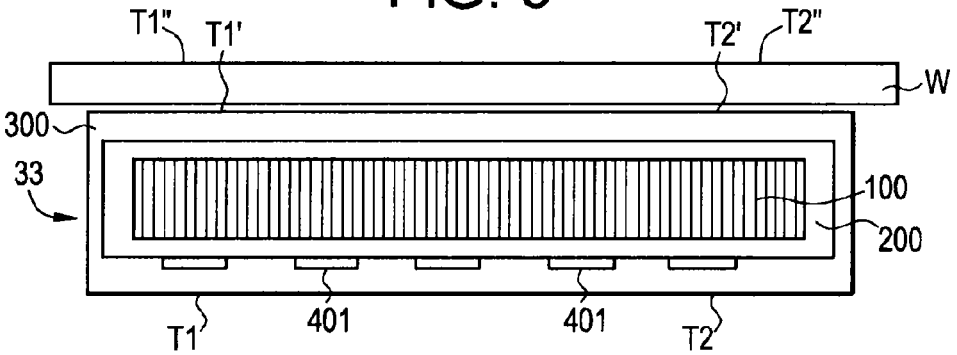
FIG. 6 is a cross-sectional view of an embodiment of a heater in the prior art, for a heater with a graphite core.

In various embodiments for a heater with a graphite core as variations of the prior art heater illustrated in FIG. 6, the heater utilizes at least an embedded TPG heat spreader 600 to distribute and/or regulate the temperature across the substrate W for a relatively uniform temperature distribution, with T1"-T2" of less than 10° C. in one embodiment, and less than 5° C. in another embodiment. Various embodiments of the heater 33 are illustrated in FIGS. 7A-7A.

Figure 7A:
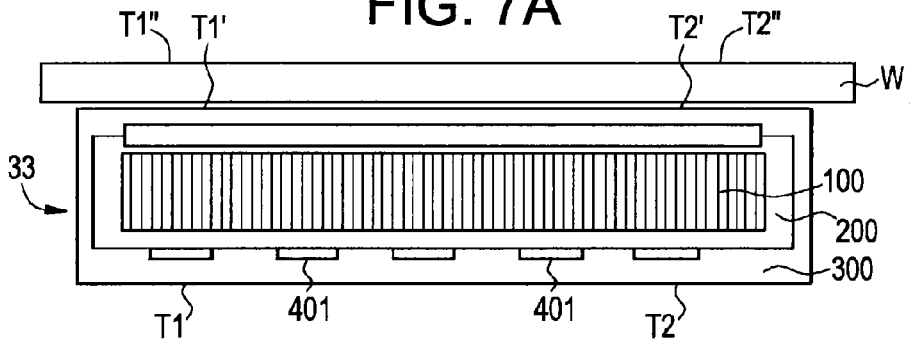
FIGS. 7A, 7B, 7C, 7D, and 7E are cross-sectional views of various embodiments of a heater comprising a graphite core.

FIG. 7A illustrates a heater 33 wherein the TPG heat spreader 600 is embedded in the heater between the base coating 200 and the overcoat layer 300. The TPG layer 600 in one embodiment is held in place simply by the adhesion of the overcoat and the base coat where they make contact. In one embodiment, the TPG layer 600 incorporates a plurality of through holes at select locations where overcoat and basecoat layers can connect and adhere). In another embodiment, the TPG 600 is glued in place with high temperature compatible glues, e.g., Ceramabond® glue from Aremco.

Figure 7B:
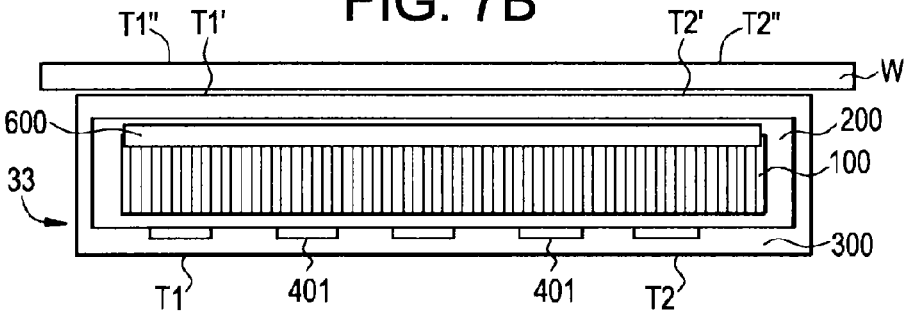

In FIG. 7B, TPG heat spreader 600 is embedded in the heater between the graphite substrate 100 and the base coating layer 200 (on the top side close to the substrate W). The TPG 600 can be held in place simply by the adhesion of the basecoat and the substrate where they make contact, or by incorporating a number of through-holes for base coat to connect and further adhere to the substrate 100, or by the use of a high-temperature adhesive. In yet another embodiment, pyrolytic graphite is deposited on the graphite substrate 100, and subsequently sent through a thermal annealing process, forming the TPG layer 600 directly adhered to the graphite substrate 100.

Figure 7C:
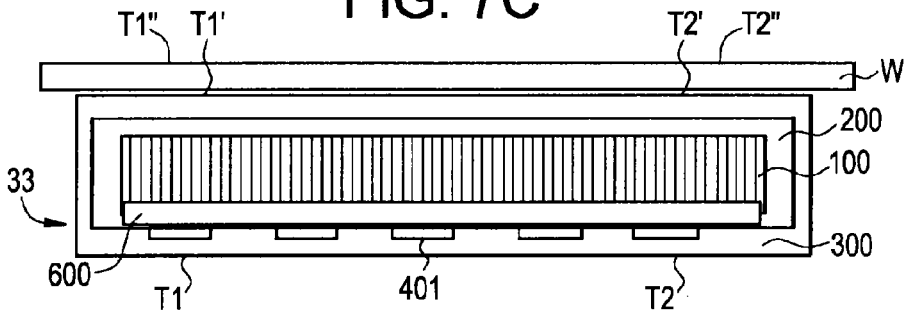

FIG. 7C is a variation of the heater 33 of FIG. 7B, with the change being in the position of the TPG heat spreader 600, which is embedded in the heater between the graphite substrate 100 and the base coat 200, and at the bottom of the graphite substrate 100.

Figure 7D:
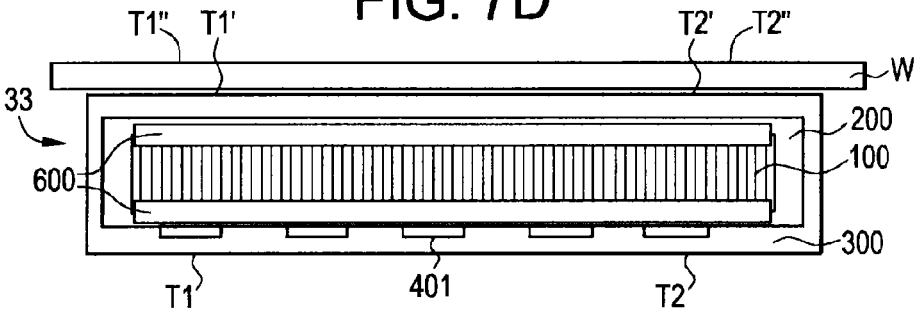
Figure 7E:
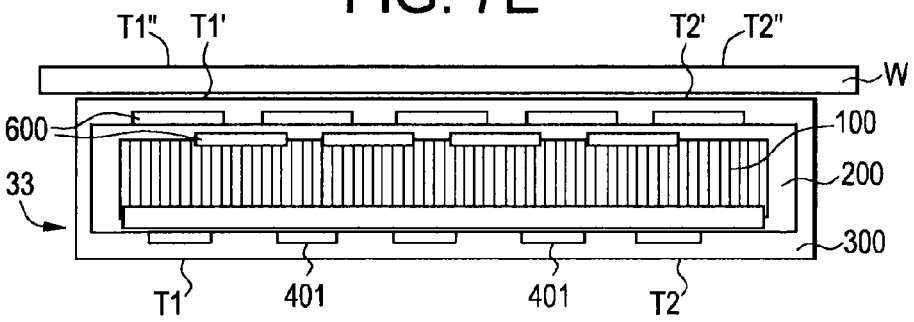

In FIG. 7D, at least 2 TPG heat spreaders 600 are used, with the heat spreaders 600 being embedded both on the top & the bottom of the heater, between the graphite substrate 100 and the base coating layer 200.

FIG. 7E illustrates an embodiment of a heater 33 wherein a plurality of TPG heat spreaders 600 are used/embedded at the top of the heater 33. In one embodiment, a plurality of through-holes are provided in the TPG layers 600 to promote adhesion between the graphite substrate, the base coat 200, and the overcoat 300. In another embodiment, smaller pieces of TPG are used forming a mosaic configuration in overlapping layers with most of the holes and boundaries are offset from one another.

In the illustrated embodiments, the electrode is positioned at the bottom (or near the bottom) of the heater 33 for optimum thermal design. However, other embodiments are anticipated (although not illustrated) for a heater with a uniform temperature distribution on the substrate, having electrode patterned at the top of the heater 33 (near the support wafer). In another embodiment (not illustrated), the TPG layer is positioned between the wafer substrate W and a patterned electrode situated at the top of the heater 33. In yet another embodiment (not illustrated), the TPG layer is still nearly as effective being located below the heater pattern for improved efficiency and heater distribution with the c-direction in the TPG layer being a barrier to heat flow.

The heater of the invention can be used in a number of different processes, including plasma-etching chamber for processing glass molds, or in semiconductor processing chambers including but not limited to atomic layer epitaxy (ALD), low pressure CVD (LPCVD), and plasma-enhanced CVD (PECVD).

The invention is further illustrated by the following non-limiting examples.

EXAMPLES

Figure 8A:
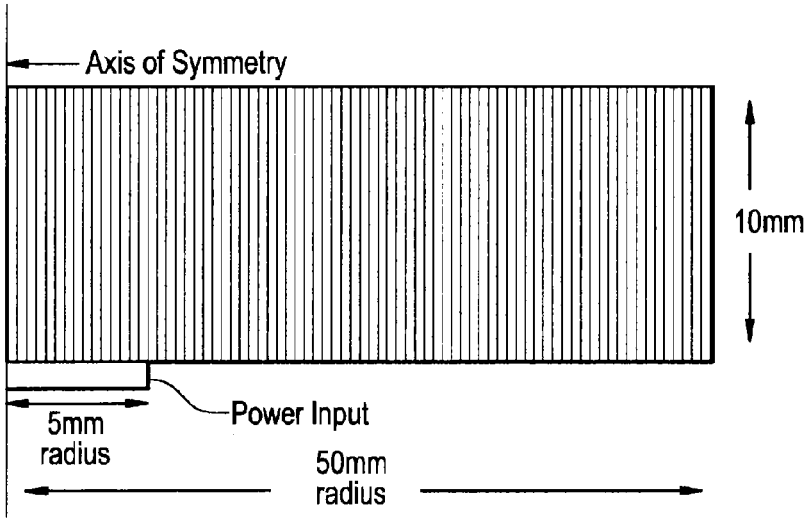
FIGS. 8A and 8B are schematic views of a thermal module employing a heater of the prior art (FIG. 8A with an AlN substrate) and an embodiment of a heater of the invention (TPG layer embedded in an AlN substrate). The modules utilize computational fluid dynamics (CFD) calculations to examine the surface temperature of the wafer substrate in a semiconductor processing operation.
Figure 8B:
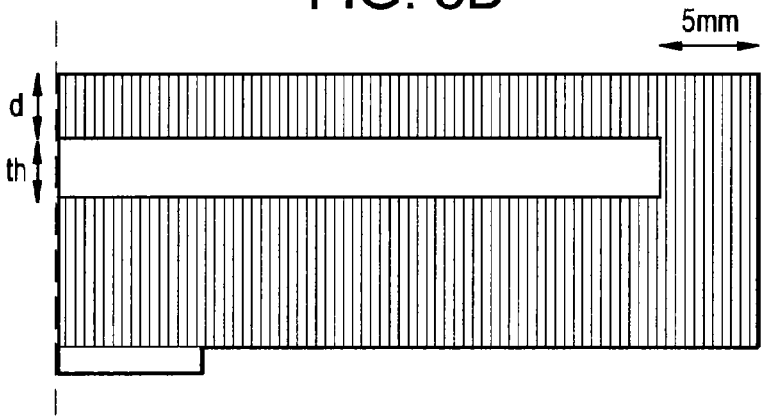

In the examples, computational fluid dynamics (CFD) calculations are carried out to model the heater assemblies. FIGS. 8A and 8B are schematic views of the model built to compare the performance of the prior art heater vs. an embodiment of the heater having at least an embedded TPG layer. The model is an axi-symmetric 2-D model.

In the model of a heater in the prior art, sintered AlN is used for the ceramic core with an isotropic thermal conductivity of 160 W/m-K. In the model of an embodiment of the heater of the invention, the TPG layer is embedded in the sintered AlN ceramic core. The TPG layer has an anisotropic thermal conductivity of 1500 W/m-K in the horizontal plane, and 20 W/m-K in the vertical plane. Perfect contact between the TPG and AlN is assumed in the calculations. The thickness of the TPG (th) is varied, as well as the distance from the top surface where th TPG is located (d).

In the models, a single wafer is heated with varying power input levels. The power is input into an electrode on the bottom of a substrate/electrode system, and the temperature is determined on the topside of the structure as a function of position. From this data, the difference in maximum and minimum temperature is calculated. As illustrated, the surfaces (with an assumed emissivity of 0.4) radiate into free space with a background temperature of 0° C. Temperature uniformity on the wafer surface is defined as the difference between the maximum temperature and minimum temperature as measured by thermocouples placed across the wafer surface. Uniformity requirement is stringent in the case of Metal Organic Chemical Vapor Deposition (MOCVD) process. Hence, every Celsius degree variation in temperature uniformity affects the deposition process. The results of the computer model are illustrated in FIGS. 9-12.

Figure 9:
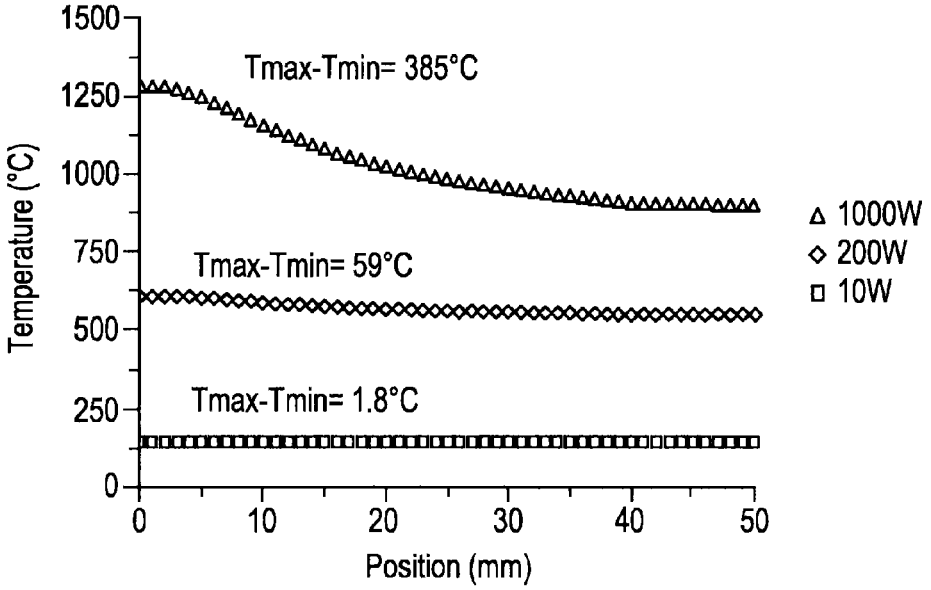
FIG. 9 is a graph illustrating the temperature distribution of the topside of a substrate in a prior art heater with AlN substrate.

FIG. 9 is a profile of the wafer temperature in the heater of the prior art with 10, 200, and 1000 W power input into the electrode. The temperature distribution on the top side of the wafer structure is modeled.

Figure 10:
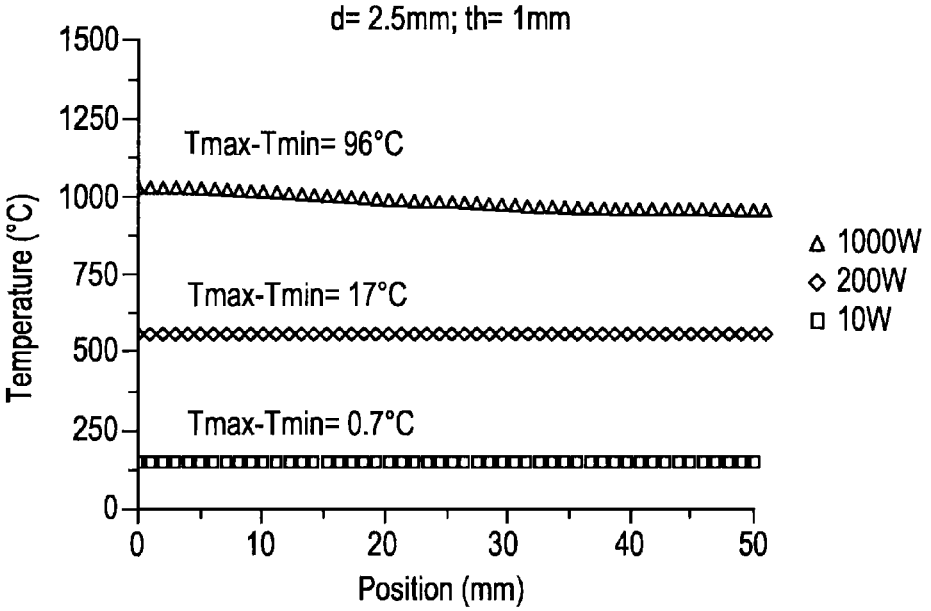
FIGS. 10, 11, and 12 are graphs illustrating the temperature distribution of topside of a substrate in various heater embodiments of the invention, with an embedded TPG layer of 1 mm, 3 mm, and 6 mm thick in an AlN substrate.
Figure 11:
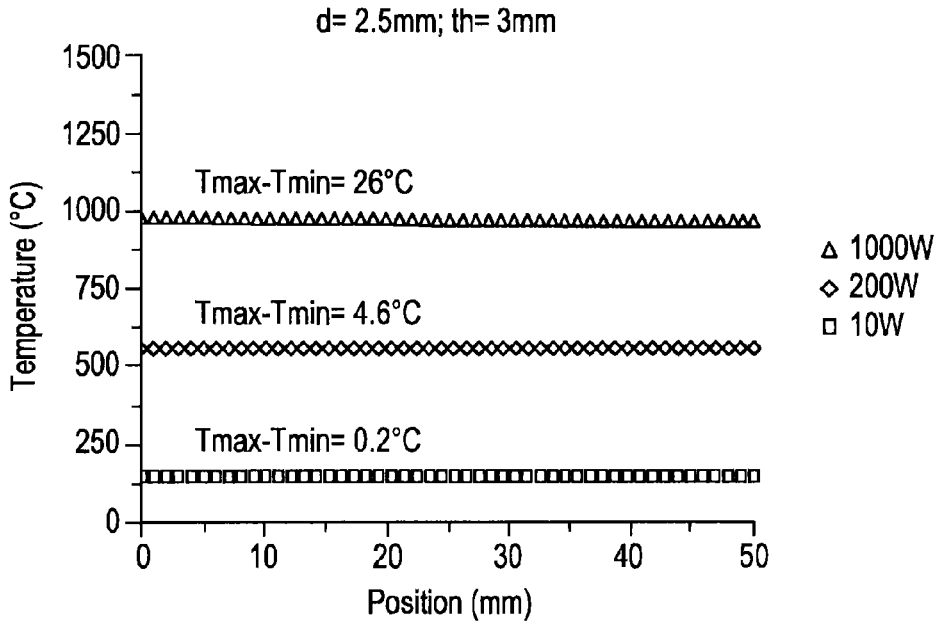
Figure 12:
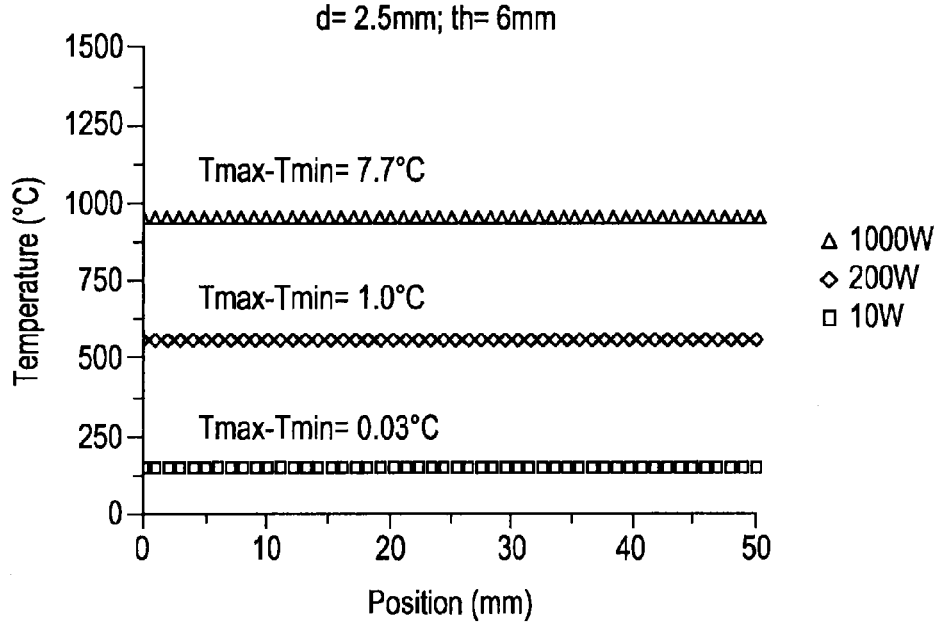

FIGS. 10-12 are profiles of various embodiments of a heater of the invention. FIG. 10 shows the temperature profile of a heater with a 1 mm thick TPG layer embedded in an AlN core substrate is used. The TPG layer is located 2.5 mm from the top, but results show that the temperature distribution is relatively insensitive to the location of the TPG layer.

In FIG. 11, a much thicker 3 mm thick TPG layer is embedded in one embodiment of an AlN core heater, wherein 10, 200, or 1000 W power are input into the electrode. The results show a marked improvement in temperature uniformity particularly with lower power input. Again, the model results show that the temperature distribution is relatively insensitive to the location of the TPG layer.

FIG. 12 shows remarkably uniform temperature distribution on the top side of the structure with an embedded 6 mm thick TPG layer 2.5 mm from the top of the heater (away from the wafer). The Tmax-Tmin varies from 0.03° C. to 7.7° C. depending on the power input level. As shown, for each power level, a TPG thickness can be optimized to enable maximum temperature uniformity across the wafer substrate, i.e., <5° C. Tmax-Tmin in one embodiment to <2° C. Tmax-Tmin for some applications.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. All citations referred herein are expressly incorporated herein by reference.

The invention claimed is:

1. An apparatus for supporting a substrate in a process chamber and regulating the surface temperature of the substrate, the apparatus comprising:

a base support having a surface adapted to support the substrate;

a heating element for heating the substrate to a temperature of at least 300° C.;

at least one layer of thermal pyrolytic graphite material embedded in the base support, the thermal pyrolytic graphite (TPG) layer having a thermal conductivity of at least 1000 W/m° C. in a plane parallel to the substrate being supported;

wherein the surface of the base support has a maximum temperature variation of 10° C. between a lowest point and a highest temperature point on the surface of the base support;

and further wherein, the base support for supporting the wafer comprises a [base] *metal* substrate comprising at least one of copper, aluminum, and alloys thereof;

the at least a layer of thermal pyrolytic graphite is embedded in the metal [base] substrate;

the heating element for heating the substrate to a temperature of at least 300° C. is embedded in the metal [base] substrate, under the thermal pyrolytic graphite layer and away from the wafer substrate.

2. An apparatus for supporting a substrate in a process chamber and regulating the surface temperature of the substrate, the apparatus comprising:

a base support having a surface adapted to support the substrate;

*a cooling element disposed in the base support* a heating element for heating the substrate to a temperature of at least 300° C.;

at least one layer of thermal pyrolytic graphite material embedded in the base support, the thermal pyrolytic graphite (TPG) layer having a thermal conductivity of at least 1000 W/m° C. in a plane parallel to the substrate being supported;

wherein the surface of the base support has a maximum temperature variation of 10° C. between a lowest point and a highest temperature point on the surface of the base support, and further wherein the base support for supporting the wafer substrate comprises a [base] *metal* substrate comprising at least one of copper, aluminum, and alloys thereof;

the heating element is sandwiched between two dielectric layers for heating the substrate to a temperature of at least 300° C. and disposed on the metal [base] substrate, the at least a layer of thermal pyrolytic graphite is embedded in the metal [base] substrate, under the heating element and dielectric layers, and away from the wafer substrate.

*3. The apparatus of claim 1 further comprising a cooling element disposed in the base support.*

*4. The apparatus of claim 1, wherein the cooling element comprises a plurality of coolant passages.*

*5. The apparatus of claim 4, wherein a coolant supplied by a coolant supplier flows through the plurality of coolant passages, thereby cooling the base support and the substrate supported by the base support.*

*6. The apparatus of claim 2, wherein the cooling element comprises a plurality of coolant passages.*

*7. The apparatus of claim 6, wherein a coolant supplied by a coolant supplier flows through the plurality of coolant passages, thereby cooling the base support and the substrate supported by the base support.*

*8. An apparatus for supporting a substrate in a process chamber and regulating the surface temperature of the substrate, the apparatus comprising:*

*(a) a base support having a surface adapted to support the substrate, the base support comprising at least one of copper, aluminum, and alloys thereof;*

*(b) an element to regulate the temperature of the substrate chosen from (i) a heating element for heating the substrate to a temperature of at least 300° C., wherein the heating element is embedded in the base support, (ii) a cooling element disposed in the base support, or (iii) both (i) and (ii);*

*at least one layer of thermal pyrolytic graphite material embedded in the base support, the thermal pyrolytic graphite (TPG) layer having a thermal conductivity of at least 1000 W/m° C. in a plane parallel to the substrate being supported;*

*wherein the surface of the base support has a maximum temperature variation of 10° C. between a lowest point and a highest temperature point on the surface of the base support.*

*9. The apparatus of claim 8, wherein the element to regulate the temperature of the substrate is a cooling element.*

*10. The apparatus of claim 9, wherein the cooling element comprises a plurality of coolant passages.*

*11. The apparatus of claim 9, wherein a coolant supplied by a coolant supplier flows through the plurality of coolant passages, thereby cooling the base support and the substrate supported by the base support.*

*12. The apparatus of claim 9, wherein the at least one layer of thermal pyrolytic graphite is disposed between the cooling element and the surface of the base support.*

*13. The apparatus of claim 8, wherein the element to regulate the temperature of the substrate is a cooling element and a heating element.*

*14. The apparatus of claim 13, wherein the cooling element comprises a plurality of coolant passages.*

*15. The apparatus of claim 13, wherein a coolant supplied by a coolant supplier flows through the plurality of coolant passages, thereby cooling the base support and the substrate supported by the base support.*

*16. The apparatus of claim 13, wherein the at least one layer of thermal pyrolytic graphite is disposed between the surface of the base support and the cooling and heating elements.*

*17. The apparatus of claim 16, wherein the heating element is disposed between the at least one layer of thermal pyrolytic graphite and the cooling element.*

*18. The apparatus of claim 8 comprising a heating element.*

* * * * *